United States Patent [19]
Hussein et al.

[11] Patent Number: 6,037,255
[45] Date of Patent: Mar. 14, 2000

[54] METHOD FOR MAKING INTEGRATED CIRCUIT HAVING POLYMER INTERLAYER DIELECTRIC

[75] Inventors: Makarem A. Hussein, Beaverton; Sam Sivakumar, Hillsboro; Rick Davis, Beaverton, all of Oreg.

[73] Assignee: Intel Corporation, Santa Clara, Calif.

[21] Appl. No.: 09/310,656

[22] Filed: May 12, 1999

[51] Int. Cl.[7] .................................................. H01L 21/283

[52] U.S. Cl. .......................... 438/675; 438/647; 438/725; 438/780

[58] Field of Search ................................. 438/618, 647, 438/675, 725, 780

[56] References Cited

U.S. PATENT DOCUMENTS

| | | | |
|---|---|---|---|
| 5,354,712 | 10/1994 | Ho et al. | 437/195 |
| 5,889,141 | 3/1999 | Marrocco, III et al. | 528/423 |

*Primary Examiner*—Chandra Chaudhari
*Assistant Examiner*—L. A. Kilday
*Attorney, Agent, or Firm*—Mark V. Seeley

[57] ABSTRACT

An improved method for making an integrated circuit that includes forming a conductive layer on a substrate, then forming a dielectric layer comprising a polymer on the conductive layer. After forming the dielectric layer, a layer of photoresist is patterned to define a region to be etched. An etched region is then formed through the dielectric layer while simultaneously removing the layer of photoresist.

15 Claims, 3 Drawing Sheets

METHOD FOR MAKING INTEGRATED CIRCUIT HAVING POLYMER INTERLAYER DIELECTRIC

FIELD OF THE INVENTION

The present invention relates to a method for making integrated circuits.

BACKGROUND OF THE INVENTION

Integrated circuits are made by forming on a substrate, such as a silicon wafer, layers of conductive material that are separated by layers of a dielectric material. Vias may be etched through the dielectric layers, then filled with a conducting material to electrically connect the separated conductive layers.

A commonly used dielectric material is silicon dioxide. Although a thermally stable and mechanically strong material, silicon dioxide has a relatively high dielectric constant. Consequently, as described in U.S. Pat. No. 5,886, 410 and copending application Ser. No. 899,133 (filed Jul. 24, 1997), each assigned to this application's assignee, certain materials—such as various organic polymers—that have a relatively low dielectric constant may be used as a dielectric material in place of silicon dioxide. When such materials are used in place of those with a higher dielectric constant, RC delay may be reduced, which can enable a higher speed device.

This application describes an improved process for making an integrated circuit that uses a polymer based dielectric as an insulation layer formed between conductive layers.

SUMMARY OF THE INVENTION

An improved method for making an integrated circuit is described. That method comprises forming a conductive layer on a substrate, then forming a dielectric layer comprising a polymer on the conductive layer. After forming the dielectric layer, a layer of photoresist is patterned to define a region to be etched. An etched region is then formed through the dielectric layer while simultaneously removing the layer of photoresist. This process may be used to make copper containing dual damascene structures, where photoresist is removed as the via is etched and also as the trench is etched.

DETAILED DESCRIPTION OF THE PRESENT INVENTION

Figure 1:
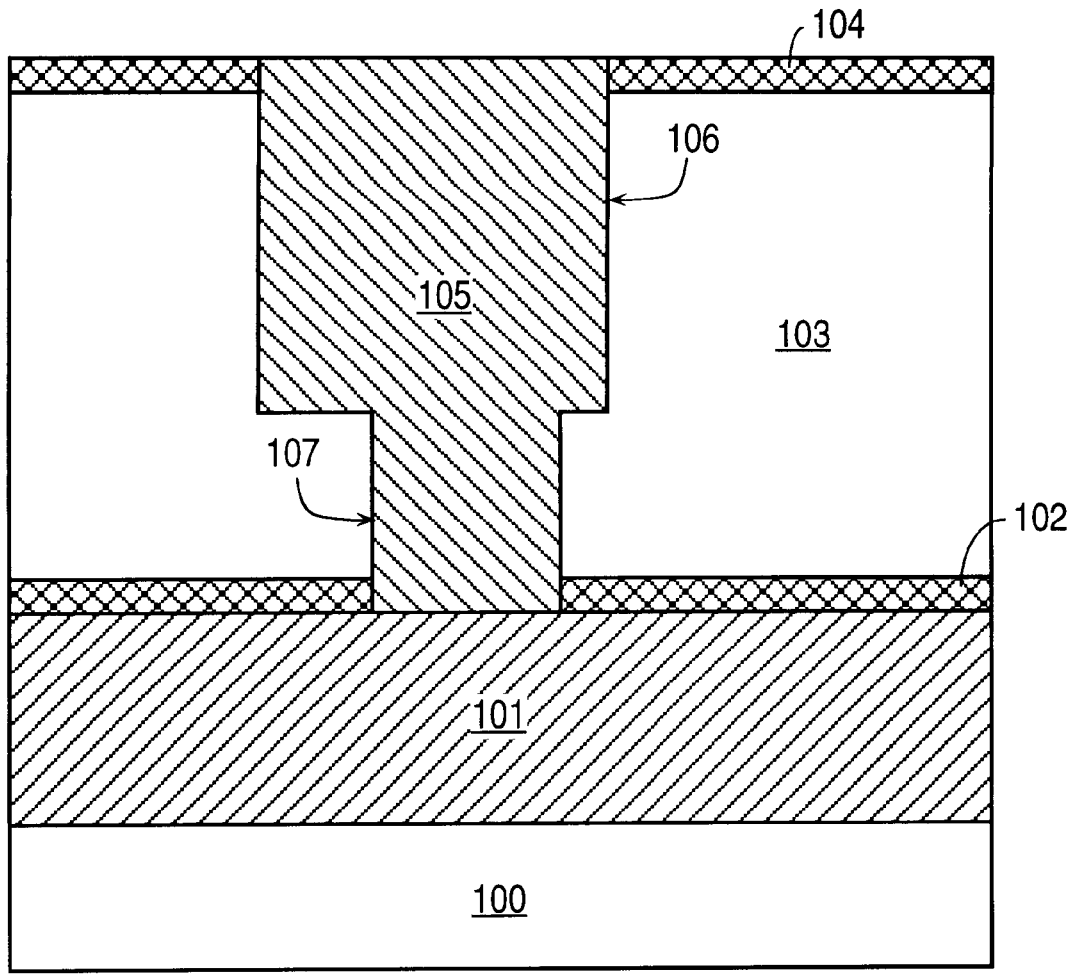
FIG. 1 illustrates a cross-section of a device that may be made using the method of the present invention.

An improved method for making an integrated circuit is described. FIG. 1 illustrates a cross-section of a device that may be made using the method of the present invention. That device includes a substrate 100 upon which is formed a first conductive layer 101. First conductive layer 101 is covered by barrier layer 102, which in turn is covered by dielectric layer 103. Hard masking layer 104 covers dielectric layer 103. A second conductive layer 105 fills trench 106 and via 107. In the device shown in FIG. 1, second conductive layer 105 is coupled to first conductive layer 101, which enables current to travel from one conductive layer to the other.

Substrate 100 may be any surface, generated when making an integrated circuit, upon which a conductive layer may be formed. Substrate 100 thus may include, for example, active and passive devices that are formed on a silicon wafer such as transistors, capacitors, resistors, diffused junctions, gate electrodes, local interconnects, etc. . . . Substrate 100 also may include insulating materials (e.g., silicon dioxide, either undoped or doped with phosphorus (PSG) or boron and phosphorus (BPSG); silicon nitride; silicon oxinitride; or a polymer) that separate such active and passive devices from the conductive layer or layers that are formed on top of them, and may include previously formed conductive layers.

Conductive layer 101 may be made from materials conventionally used to form conductive layers for integrated circuits. For example, conductive layer 101 may be made from copper, a copper alloy, aluminum or an aluminum alloy, such as an aluminum/copper alloy. Alternatively, conductive layer 101 may be made from doped polysilicon or a silicide, e.g., a silicide comprising tungsten, titanium, nickel or cobalt.

Conductive layer 101 may include a number of separate layers. For example, conductive layer 101 may comprise a primary conductor made from an aluminum/copper alloy that is sandwiched between a relatively thin titanium layer located below it and a titanium, titanium nitride double layer located above it. Alternatively, conductive layer 101 may comprise a copper layer formed on underlying barrier and seed layers.

Although a few examples of the types of materials that may form conductive layer 101 have been identified here, conductive layer 101 may be formed from various other materials that can serve to conduct electricity within an integrated circuit. Although copper is preferred, the use of any other conducting material, which may be used to make an integrated circuit, falls within the spirit and scope of the present invention.

As shown in FIG. 1, barrier layer 102 covers first conductive layer 101. Barrier layer 102 may inhibit diffusion into dielectric layer 103 of copper or other elements that may be included in conductive layer 101. In addition, barrier layer 102 may perform an etch stop function - a function which may be particularly desirable if a via etched through the overlying dielectric layer is unlanded. Barrier layer 102 preferably comprises silicon nitride, but may be made of other materials that can inhibit diffusion from conductive layer 101 into dielectric layer 103 and provide high selectivity to etch chemistry used to etch a layer, or layers, formed on top of barrier layer 102. Other materials that may provide such properties include titanium nitride or oxynitride.

Barrier layer 102 should be thick enough to perform such functions, but not so thick that it adversely impacts the overall dielectric characteristics resulting from the combination of barrier layer 102 and dielectric layer 103. To balance these two factors, the thickness of barrier layer 102 preferably should be less than about 10% of the thickness of dielectric layer 103.

Dielectric layer 103 comprises a polymer—preferably one with a low dielectric constant: preferably less than about 3.5 and more preferably between about 1.5 and about 3.0. Because of layer 103's low dielectric constant, the capacitance between various conductive elements that are separated by layer 103 should be reduced, when compared to the capacitance resulting from use of other conventionally used dielectric materials—such as silicon dioxide. Such reduced capacitance may decrease the RC delay that would otherwise exist and may also decrease undesirable cross-talk between conductive lines.

Dielectric layer 103 may comprise an organic polymer. Such organic polymers include, for example, polyimides, parylenes, polyarylethers, polynaphthalenes, and polyquinolines, or copolymers thereof. A commercially available polymer sold by Allied Signal, Inc., under the trade name FLARE™, may be used to form dielectric layer 103. Dielectric layer 103 preferably may be etched at substantially the same rate that photoresist is etched, and preferably has adhesion characteristics that enable it's use as an insulator for single and dual damascene structures that provide the metal interconnect.

Dielectric layer 103 preferably has a thickness of between about 2,000 and about 20,000 angstroms. Although several examples of materials that can be used to make dielectric layer 103 have been identified here, any polymer that may insulate one conductive layer from another is within the spirit and scope of the present invention.

Above dielectric layer 103 is hard masking layer 104. (Although FIG. 1 shows retention of hard masking layer 104, those skilled in the art will appreciate that layer 104 may be completely removed during the chemical mechanical polishing step used to remove metal, which fills via 107 and trench 106, from above layer 104). Hard masking layer 104 serves as an etch stop layer, which protects dielectric layer 103. As described below, in the method of the present invention substantially all of the photoresist may be removed, when the via and trench are etched. When all the photoresist is removed, an etch stop layer must be formed underneath the photoresist to protect the underlying dielectric layer. Hard masking layer 104 also protects dielectric layer 103, when a chemical mechanical polishing ("CMP"), or other process, is used to remove excess metal, or other conductive material, from above dielectric layer 103. The thickness of hard masking layer 104 may be dictated by the CMP requirement, and preferably is between about 100 and 2,000 angstroms.

The same material used to make barrier layer 102, such as silicon nitride, may be used to make hard masking layer 104. Alternatively, silicon dioxide may be used to make hard masking layer 104 while silicon nitride is used to make barrier layer 102. When silicon dioxide is used as a hard masking layer that covers a polymer, a thin layer of silicon nitride, e.g., one that is less than a few hundred angstroms thick, should be formed between the silicon dioxide hard mask and the polymer. Such a thin nitride layer can protect dielectric layer 103 from exposure to any oxygen containing plasma used to deposit the silicon dioxide layer.

Although examples of materials that can be used to make hard masking layer 104 have been identified here, the use of any material capable of providing the functions described above is within the spirit and scope of the present invention.

As shown in FIG. 1, second conductive layer 105 fills trench 106 and via 107. Conductive layer 105 may comprise any of the materials identified above in connection with conductive layer 101. Conductive layer 105 may comprise the same conductive material as conductive layer 101, or may comprise a conductive material different from the material used to make conductive layer 101.

Conductive layer 105 preferably comprises copper, formed on barrier and seed layers used to line trench 106 and via 107. The barrier layer may comprise a refractory material, such as titanium nitride or tantalum, but may also include an insulating material, such as silicon nitride. Such an insulating barrier layer should be removed from the bottom of the via to allow conductive layer 105 to contact the underlying metal, as described in Ser. No. 163,847, filed Sep. 30, 1998 and assigned to this application's assignee. The barrier layer formed beneath conductive layer 105 preferably is between about 100 and 500 angstroms thick. When an electroplating process is used to form conductive layer 105 from copper, a seed material may be deposited on the barrier layer prior to depositing the copper. Suitable seed materials for the deposition of copper include copper and nickel.

As with conductive layer 101, conductive layer 105 may be formed from various materials that can serve to conduct electricity within an integrated circuit. Furthermore, although the embodiment shown in FIG. 1 shows only one dielectric layer and two conductive layers, the number of conductive and dielectric layers included in the resulting integrated circuit may vary, as is well known to those skilled in the art.

Set forth below is a description of an embodiment of the method of the present invention, presented in the context of making the device shown in FIG. 1. That description is made with reference to FIGS. 2a–2d, which illustrate cross-sections of structures that result after using certain steps.

First, a substrate 100 is provided, which may already include many of the myriad of devices, materials and structures used to form integrated circuits. Conductive layer 101 is then formed on substrate 100. Conductive layer 101 may be formed by a chemical vapor or physical deposition process, like those that are well known to those skilled in the art. Alternatively, where copper is used to make conductive layer 101, a conventional copper electroplating process may be used. Such a process typically comprises depositing a barrier layer followed by depositing a seed material, then performing a copper electroplating process to produce the copper line, as is described in copending applications Ser. Nos. 163,847 and 223,472 (filed Sep. 30, 1998 and Dec. 30, 1998, respectively, and each assigned to this application's assignee), and as is well known to those skilled in the art.

Figure 2A:
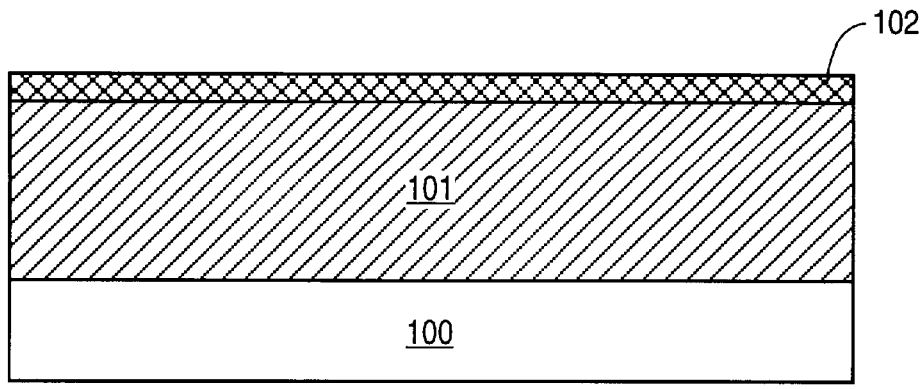
FIGS. 2a–2d illustrate cross-sections that reflect structures that may result after certain steps are used, when making the device represented by FIG. 1 following the method of the present invention.

After forming conductive layer 101 on substrate 100, barrier layer 102 is formed on conductive layer 101. Barrier layer 102 will serve to prevent an unacceptable amount of copper, or other metal, from diffusing into polymer 103. Barrier layer 102 may also act as an etch stop for preventing subsequent via and trench etch steps from etching into an insulating material formed adjacent to conductive layer 101. Barrier layer 102 preferably is made from silicon nitride, but may be made from other materials that can serve such functions, as is well known to those skilled in the art. When formed from nitride, a chemical vapor deposition process may be used to form barrier layer 102. Conductive layer 101 and barrier layer 102 may be planarized, after they are deposited, using a CMP step. FIG. 2a illustrates a cross-section of the structure that results after conductive layer 101 and barrier layer 102 have been formed on substrate 100.

Dielectric layer 103, which comprises a polymer, is then formed on top of barrier layer 102, preferably by spin coating the polymer onto the surface of barrier layer 102, using conventionally employed equipment and process steps. Dielectric layer 103 preferably is between about 2,000 and 20,000 angstroms thick.

Figure 2B:
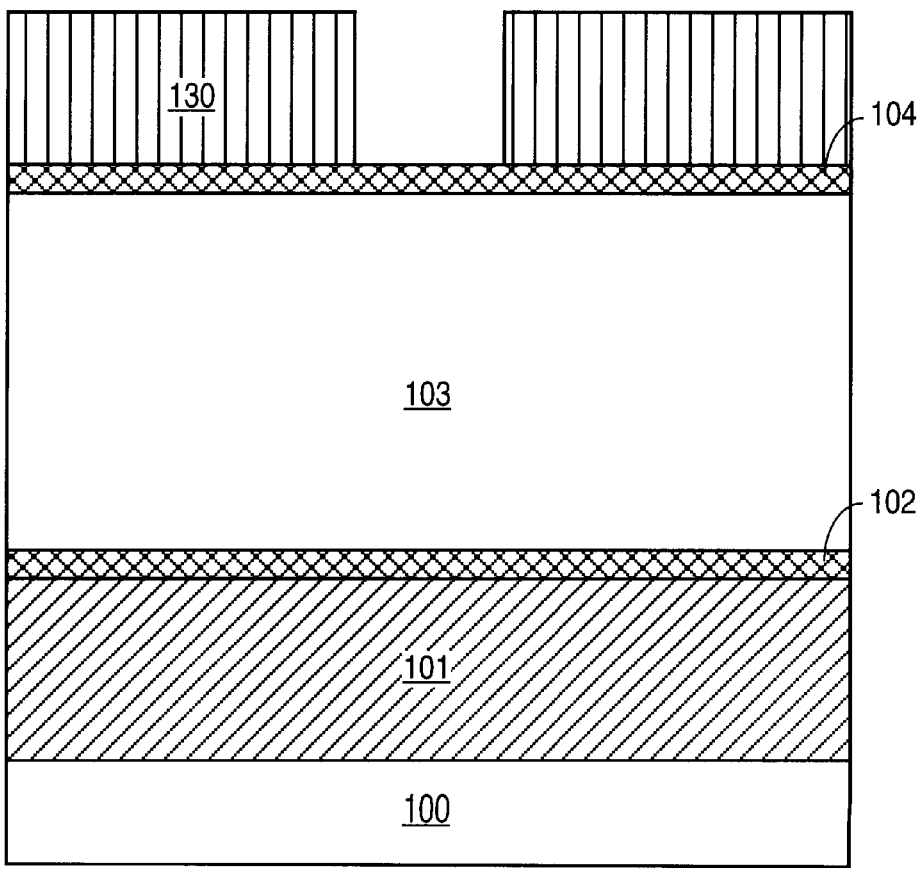

After forming dielectric layer 103, hard masking layer 104 is formed on top of it, preferably by chemical vapor deposition. The minimum thickness required for hard masking layer 104 may be dictated by the process used to perform a subsequent CMP step to remove excess metal formed on the surface of that layer. As mentioned above, the preferred materials for making hard masking layer 104 are silicon nitride and silicon dioxide, although other materials, such as SiOF, may be used. Next, a photoresist layer 130 is patterned on top of hard masking layer 104 to define a via formation region for receiving a subsequently formed conductive layer that will contact conductive layer 101. Photoresist layer 130 may be patterned using conventional photolithographic techniques, such as masking the layer of photoresist, exposing the masked layer to light, then developing the unexposed portions. The resulting structure is shown in FIG. 2b.

Figure 2C:
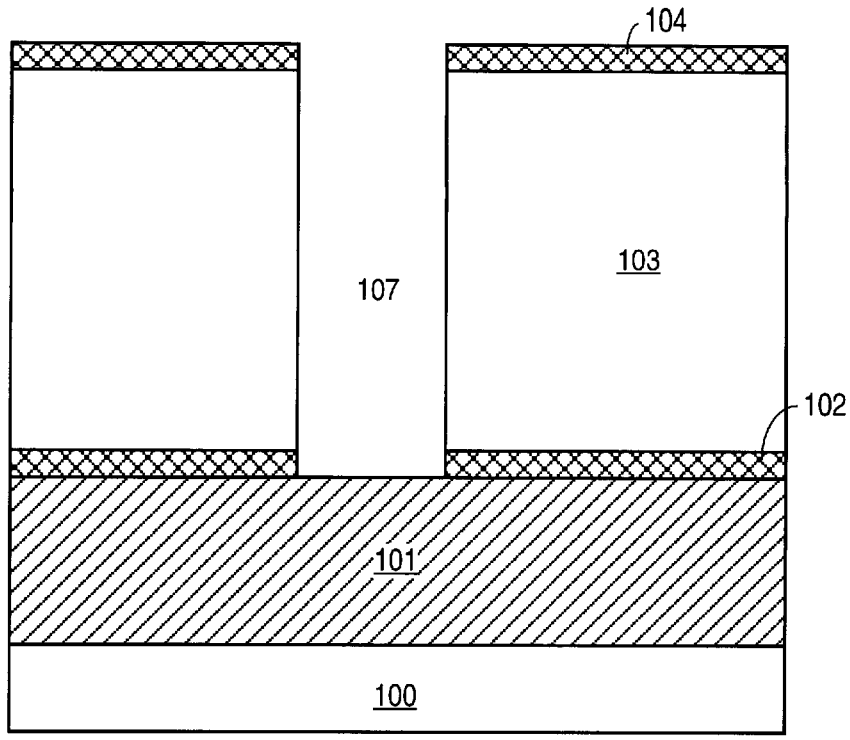

After photoresist 130 is patterned, via 107 is etched through hard masking layer 104 and dielectric layer 103 down to barrier layer 102. In this two step process, the exposed section of layer 104 may be anisotropically etched using a conventional plasma etch process. After layer 104 is etched, polymer 103 is etched. If layer 103 comprises a polymer that is susceptible to damage when exposed to a wet clean process, an all dry method is preferably used to etch via 107 through layer 103. Such a dry etch process may employ a plasma etch process that uses a plasma that contains nitrogen and either hydrogen or oxygen. Because such a dry etch process can remove both photoresist 130 and polymer 103, via 107 can be etched through polymer 103 at the same time photoresist 130 is removed. The resulting structure is as shown in FIG. 2c.

The etch chemistry described above may be used to simultaneously remove photoresist 130 and polymer 103 at substantially the same rate. When such an etch chemistry is used, photoresist 130 preferably is no thicker than layer 103, to ensure that substantially all of the photoresist is consumed when via 107 is etched through layer 103. If, on the other hand, an etch chemistry is used that etches polymer 103 and photoresist 130 at different rates, then a ratio of photoresist thickness to polymer thickness should be selected that ensures removal of substantially all of the photoresist when the via is etched. Because the described method removes photoresist 130 at the same time layer 103 is etched, the process of the present invention dispenses with otherwise necessary photoresist ashing and via clean steps. Hard masking layer 104 acts as an etch stop to protect dielectric layer 103, when the photoresist is removed.

After via 107 is formed, trench 106 may be formed as follows. A photoresist layer is first patterned on top of hard masking layer 104 to define a trench formation region. That photoresist layer may be patterned using conventional photolithographic techniques. After the photoresist layer is patterned, the exposed portion of hard masking layer 104 is etched. When hard masking layer 104 and barrier layer 102 are made from the same material, e.g., silicon nitride, hard masking layer 104 and barrier layer 102 (which was exposed by the via etch step) may be simultaneously etched. When hard masking layer 104 and barrier layer 102 are made from different materials, e.g., silicon dioxide and silicon nitride, respectively, hard masking layer 104 may be removed while barrier layer 102 is retained. The same equipment and process steps used to etch layer 104, when forming via 107, may be used to etch the exposed portion of hard masking layer 104 to define trench 106.

Figure 2D:
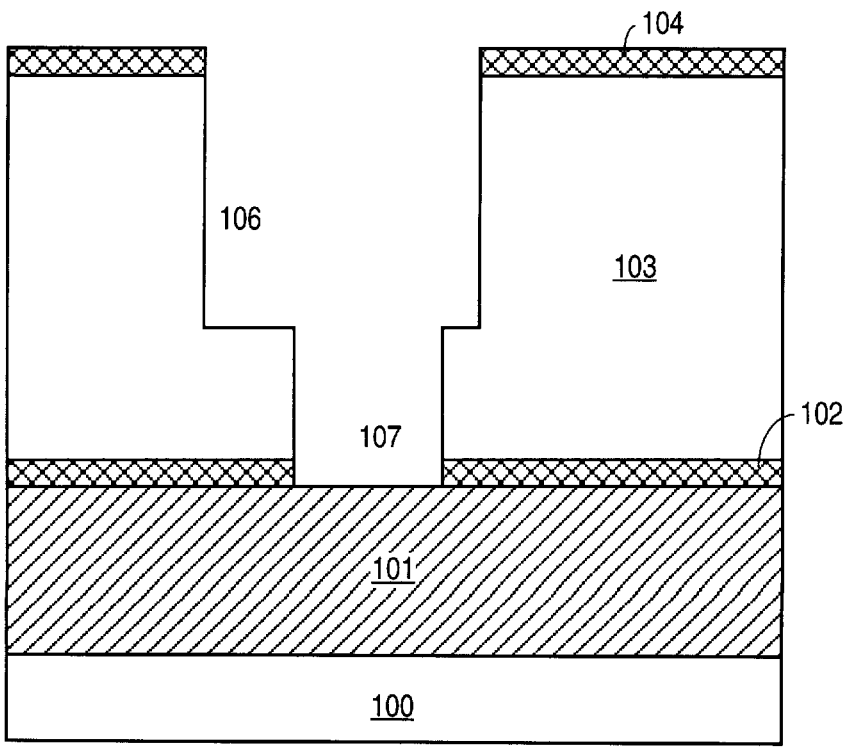

Next, trench 106 is etched into dielectric layer 103. The same equipment and process used to etch via 107 through dielectric layer 103 may be used to etch trench 106. As described above, such a process may remove photoresist at the same time dielectric layer 103 is etched, which can obviate the need to subsequently ash the photoresist or clean the trench to remove residue left by such an ashing step. FIG. 2d shows the structure that the trench etching step produces—when hard masking layer 104 and barrier layer 102 are etched at the same time, prior to etching trench 106.

As with the via formation step, when the photoresist layer and dielectric layer 103 are made from materials that may be etched at substantially the same rate, the photoresist layer preferably should be no thicker than the trench to be etched, to ensure substantially complete removal of photoresist during the trench formation step. For example, the photoresist layer should be no thicker than about 8,000 angstroms, when a trench of about 8,000 angstroms is desired.

In the device shown in FIG. 1 conductive layer 105 contacts conductive layer 101 in a "landed" fashion, that is, no portion of conductive layer 105 extends laterally over an insulation layer that borders conductive layer 101. In other devices, however, conductive layer 105 may contact conductive layer 101 in an "unlanded" fashion. When making such a device, the via etched through dielectric layer 103 will not strike conductive layer 101 squarely, but instead spill over onto the region adjacent that conductive layer.

When the method of the present invention is applied to processes that etch unlanded vias, the insulating material formed adjacent to the conductive layer must be protected when the trench is etched. One way to protect that layer is to retain barrier layer 102 for use as an etch stop when trench 106 is etched. After trench 106 is etched, the portion of barrier layer 102 that separates via 107 from conductive layer 101 may be removed. When copper is used for conductive layer 105, that portion of barrier layer 102 should be removed before any copper electroplating step is applied to fill via 107 and trench 106.

After trench 106 and via 107 are etched, they are filled with second conductive layer 105. Preferably, conductive layer 105 is made of copper, and is formed using a conventional copper electroplating process. When an excess amount of the material used to make layer 105 is formed on the surface of hard masking layer 104, a CMP step may be applied to remove the excess material and to planarize the surface of layer 105. When an electroplating process is used to form conductive layer 105 from copper, that CMP step removes both the excess copper and the underlying barrier layer.

Hard masking layer 104 provides a CMP stop layer for such a CMP step. FIG. 1 shows the structure that results after filling trench 106 and via 107 with a conductive material, then applying a CMP step to remove excess material from the surface of layer 104 to produce conductive layer 105. The process described above may be repeated to form additional conductive and insulating layers until the desired integrated circuit is produced.

The improved method for making an integrated circuit of the present invention enables removal of photoresist at the same time the via and trench are etched. Such a method, which employs an all dry approach to etching polymer 103, enables a dual damascene structure, e.g., one containing a copper conducting layer, to be formed within a polymer interlayer dielectric. Although the foregoing description has specified certain steps, materials, and equipment that may be used in such a method to make such an integrated circuit, those skilled in the art will appreciate that many modifications and substitutions may be made. For example, although the improved method of the present invention has been described in the context of making a dual damascene device, this invention is not limited to that particular application. On the contrary, applicants' improved method encompasses any process that removes photoresist at the same time a region is etched into a polymer dielectric layer. Accordingly, it is intended that all such modifications, alterations, substitutions and additions be considered to fall within the spirit and scope of the invention as defined by the appended claims.

What is claimed is:

1. A method of forming an integrated circuit comprising:

forming a conductive layer on a substrate; then forming a dielectric layer comprising a polymer on the conductive layer;

patterning a layer of photoresist, after forming the dielectric layer, to define a region to be etched; and forming an etched region through the dielectric layer while simultaneously removing substantially all of the layer of photoresist.

2. The method of claim 1 wherein a plasma that comprises nitrogen and either hydrogen or oxygen is used to remove the entire layer of photoresist when forming the etched region.

3. The method of claim 2 further comprising:

forming a barrier layer on the surface of the conductive layer prior to forming the dielectric layer;

removing part of the barrier layer after forming the etched region; and filling the etched region with a second conductive layer.

4. The method of claim 2 further comprising:

forming a hard masking layer on the surface of the dielectric layer;

removing part of the hard masking layer prior to forming the etched region; and filling the etched region with a second conductive layer.

5. The method of claim 2 wherein the polymer is selected from the group consisting of polyimides, parylenes, polyarylethers, polynaphthalenes, and polyquinolines, or copolymers thereof.

6. A method of forming an integrated circuit comprising:

forming a first conductive layer on a substrate;

forming a barrier layer on the surface of the first conductive layer;

forming a dielectric layer comprising a polymer on the surface of the barrier layer;

forming a hard masking layer on the surface of the dielectric layer;

patterning a first layer of photoresist, after forming the hard masking layer, to define a first etched region;

removing a first part of the hard masking layer;

forming a first etched region through the dielectric layer while simultaneously removing substantially all of the first layer of photoresist;

patterning a second layer of photoresist, after forming the first etched region, to define a second etched region;

removing a second part of the hard masking layer;

forming a second etched region within the dielectric layer while simultaneously removing substantially all of the second layer of photoresist; and filling the first etched region and the second etched region with a second conductive layer.

7. The method of claim 6 wherein the first part of the hard masking layer is removed using an anisotropic dry etch that has a higher selectivity for the hard masking layer than for the polymer and further comprising removing part of the barrier layer when the second part of the hard masking layer is removed using an anisotropic dry etch that has a higher selectivity for the hard masking layer and the barrier layer than for the polymer.

8. The method of claim 7 wherein a plasma that comprises nitrogen and either hydrogen or oxygen is used to etch the first layer of photoresist and the first etched region simultaneously and a plasma containing nitrogen and either hydrogen or oxygen is used to etch the second layer of photoresist and the second etched region simultaneously.

9. The method of claim 8 wherein the entire first layer of photoresist is removed when etching the first etched region; and the entire second layer of photoresist is removed when etching the second etched region.

10. The method of claim 6 further comprising removing part of the barrier layer after removing the second part of the hard masking layer.

11. The method of claim 10 wherein the first conductive layer and the second conductive layer each comprise copper, the barrier layer comprises silicon nitride, the hard masking layer comprises silicon dioxide, and the polymer is selected from the group consisting of polyimides, parylenes, polyarylethers, polynaphthalenes, and polyquinolines, or copolymers thereof.

12. A method of forming an integrated circuit comprising:

forming a first conductive layer on a substrate;

forming a barrier layer on the surface of the first conductive layer;

forming a dielectric layer comprising a polymer on the surface of the barrier layer;

forming a hard masking layer on the surface of the dielectric layer;

patterning a first layer of photoresist, after forming the hard masking layer, to define a first etched region;

removing a first part of the hard masking layer using an anisotropic dry etch that has a higher selectivity for the hard masking layer than for the polymer;

forming a first etched region through the dielectric layer while simultaneously removing substantially all of the first layer of photoresist;

patterning a second layer of photoresist, after forming the first etched region, to define a second etched region;

removing a second part of the hard masking layer simultaneously with removing part of the barrier layer using an anisotropic dry etch that has a higher selectivity for the hard masking layer and the barrier layer than for the polymer;

forming a second etched region within the dielectric layer while simultaneously removing substantially all of the second layer of photoresist; and filling the first etched region and the second etched region with a second conductive layer.

13. The method of claim 12 wherein a plasma that comprises nitrogen and either hydrogen or oxygen is used to remove the entire first layer of photoresist when etching the first etched region, and a plasma that comprises nitrogen and either hydrogen or oxygen is used to remove the entire second layer of photoresist when etching the second etched region.

14. The method of claim 13 wherein the first conductive layer and the second conductive layer each comprise copper, the barrier layer and the hard masking layer each comprise silicon nitride, and the polymer is selected from the group consisting of polyimides, parylenes, polyarylethers, polynaphthalenes, and polyquinolines, or copolymers thereof.

15. The method of claim 12, wherein the thickness of the barrier layer is less than about 10% of the thickness of the dielectric layer.

* * * * *